(12) United States Patent
Kintis et al.

(10) Patent No.: US 7,570,129 B2
(45) Date of Patent: Aug. 4, 2009

(54) 3D MMIC BALUN AND METHODS OF MAKING THE SAME

(75) Inventors: Mark Kintis, Manhattan Beach, CA (US); Flavia S. Fong, Monterey Park, CA (US); Xing Lan, La Palma, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 209 days.

(21) Appl. No.: 11/218,968

(22) Filed: Sep. 2, 2005

(65) Prior Publication Data

US 2007/0052491 A1 Mar. 8, 2007

(51) Int. Cl.
*H01F 5/00* (2006.01)
(52) U.S. Cl. .......................... 333/25; 333/26; 336/200
(58) Field of Classification Search .................. 333/25, 333/26; 336/200, 232
See application file for complete search history.

(56) References Cited

U.S. PATENT DOCUMENTS

| | | | |
|---|---|---|---|
| 5,425,167 A | 6/1995 | Shiga et al. | |
| 5,451,914 A | 9/1995 | Stengel | |
| 5,497,137 A | 3/1996 | Fujiki | |
| 6,097,273 A | 8/2000 | Frye et al. | |
| 6,380,821 B1 | 4/2002 | Imbornone et al. | |
| 6,476,704 B2 | 11/2002 | Goff | |
| 6,501,363 B1 | 12/2002 | Hwu et al. | |
| 6,683,510 B1 | 1/2004 | Padilla | |
| 6,888,253 B1 | 5/2005 | Rogers et al. | |
| 2005/0099241 A1 | 5/2005 | Ezzeddine | |

FOREIGN PATENT DOCUMENTS

JP        2002050910       2/2002

OTHER PUBLICATIONS

Communication Relating to the Results of the Partial International Search for corresponding PCT/US2006/033954completed by Officer Eva Weman and mailed on Jan. 24, 2007.

*Primary Examiner*—Stephen E Jones
(74) *Attorney, Agent, or Firm*—Tarolli, Sundheim, Covell & Tummino LLP

(57) ABSTRACT

A three dimensional (3D) monolithic integrated circuit (MMIC) balun and methods of making the same are provided. A primary spiral winding is spaced apart from a secondary primary winding by a gap in a substantially aligned stacked configuration forming a balun. The gap medium can be a low dielectric constant material if employing a multi-metal process or air if employing a wafer level packaging process.

18 Claims, 3 Drawing Sheets

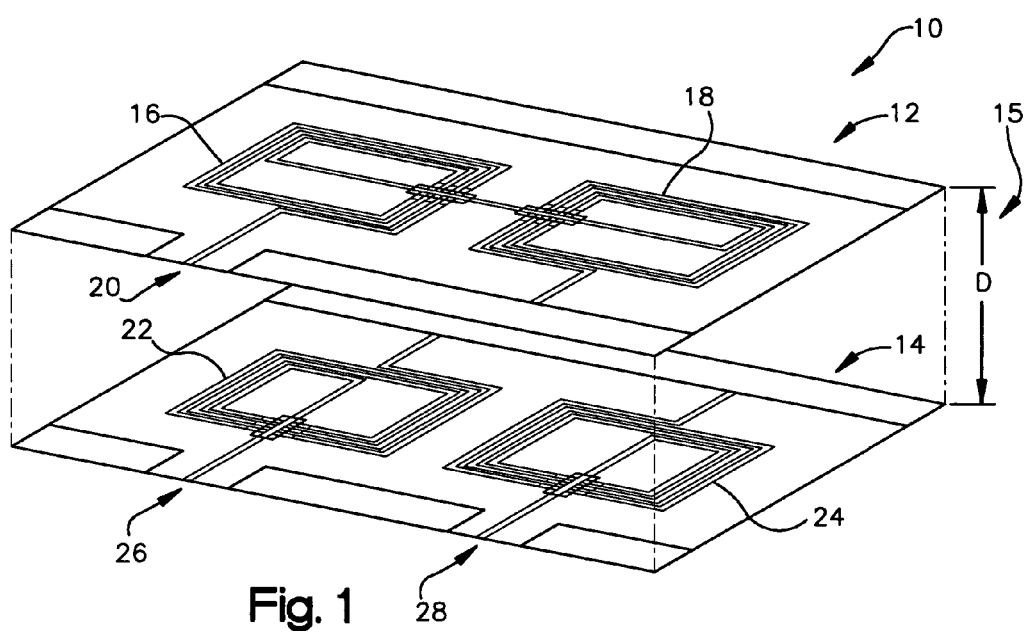
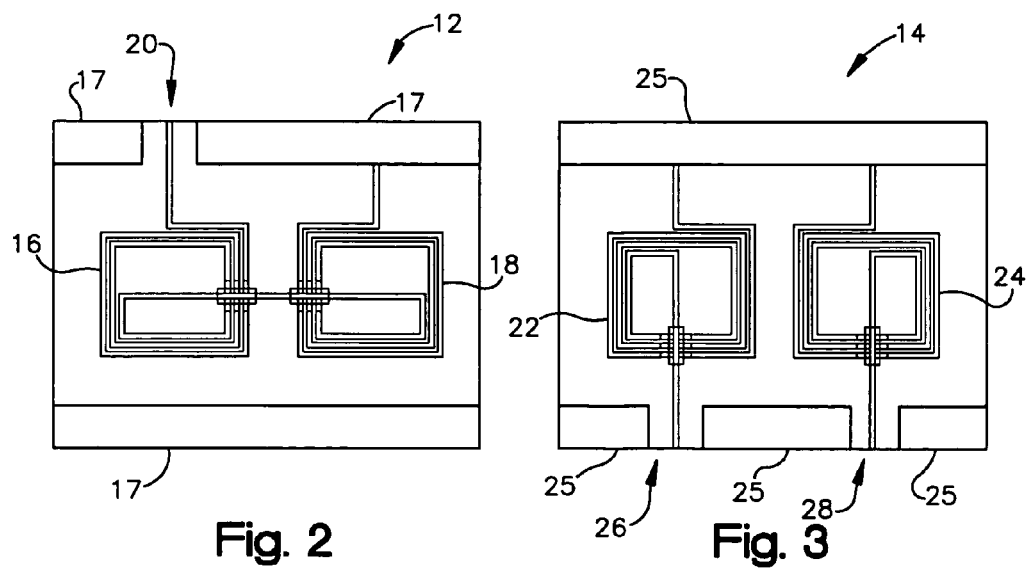

3D MMIC BALUN AND METHODS OF MAKING THE SAME

TECHNICAL FIELD

The present invention relates generally to electronics, and more particularly to a three dimensional (3D) microwave monolithic integrated circuit (MMIC) balun and methods of making the same.

BACKGROUND

Baluns are widely used in electrical and electronic engineering for the purpose of converting a balanced input to an unbalanced output or vice versa. In radio frequency (RF) and microwave monolithic integrated circuits (MMICs), baluns are usually used for designing, for example, push-pull low-noise amplifiers (LNA) or double balanced mixers. The balun can be one of the most critical components in determining the circuit's overall performances. For example, it enables high linearity performance for the push-pull configured amplifiers. Furthermore, numerous modern electronic systems demand baluns that can operate over a substantially wide frequency band for both military and commercial applications. Most reported MMIC wideband baluns, however, are of octave bandwidth or less with high insertion loss.

Typical designs involving baluns having primary and secondary windings that are configured on the same plane. Although operable, these planar balun designs have very limited bandwidth due to low self-resonant frequency or large parasitic capacitance. Implementation of a true wideband balun needs to overcome many technical obstacles. For example, designing baluns in regular MMIC processing is often quite limited due to the low self-resonance frequency (SRF) as well as low quality factor (Q) of the balun windings. Another difficulty lies in the fact that it is difficult to extend the operation band to a substantially lower frequency, since it requires more turns of winding. The increased number of turns introduces much unwanted parasitic capacitance, which in turn dramatically lowers the self-resonant frequency of a balun. As a result, the operation bandwidth is limited.

SUMMARY

In one aspect of the present invention, a three dimensional (3D) monolithic integrated circuit (MMIC) balun is provided. The 3D MMIC balun comprises a twin spiral secondary winding and a twin spiral primary winding arranged in a stacked configuration with the twin spiral secondary winding spaced apart from the twin spiral primary winding by a gap having a selectable distance. The gap extends over at least a substantial area of both the twin spiral secondary winding and the twin spiral primary winding.

In another aspect of the invention, a 3D microwave monolithic integrated circuit (MMIC) balun is provided. The MMIC balun comprises a secondary winding disposed on a first wafer and a primary winding disposed on a second wafer. The first and second wafers are arranged in a stacked configuration with the secondary winding spaced apart from the primary winding by an air gap having a selectable distance.

In yet another aspect of the invention, a method for forming a 3D MMIC balun is provided. The method comprises forming a twin spiral secondary winding on a first plane and forming a twin spiral primary winding on a second plane substantially parallel and spaced apart from the twin spiral by a gap from the first plane, wherein the twin spiral secondary winding and the twin spiral primary winding are substantially aligned in a stacked configuration.

BRIEF DESCRIPTION OF THE DRAWINGS

FIG. 1 illustrates a perspective view of a 3D MMIC balun in accordance with an aspect of the present invention.

FIG. 2 illustrates a plan view of a face of the twin spiral primary winding of FIG. 1.

FIG. 3 illustrates a plan view of a face of the twin spiral secondary winding of FIG. 1.

DETAILED DESCRIPTION

Figure 4:
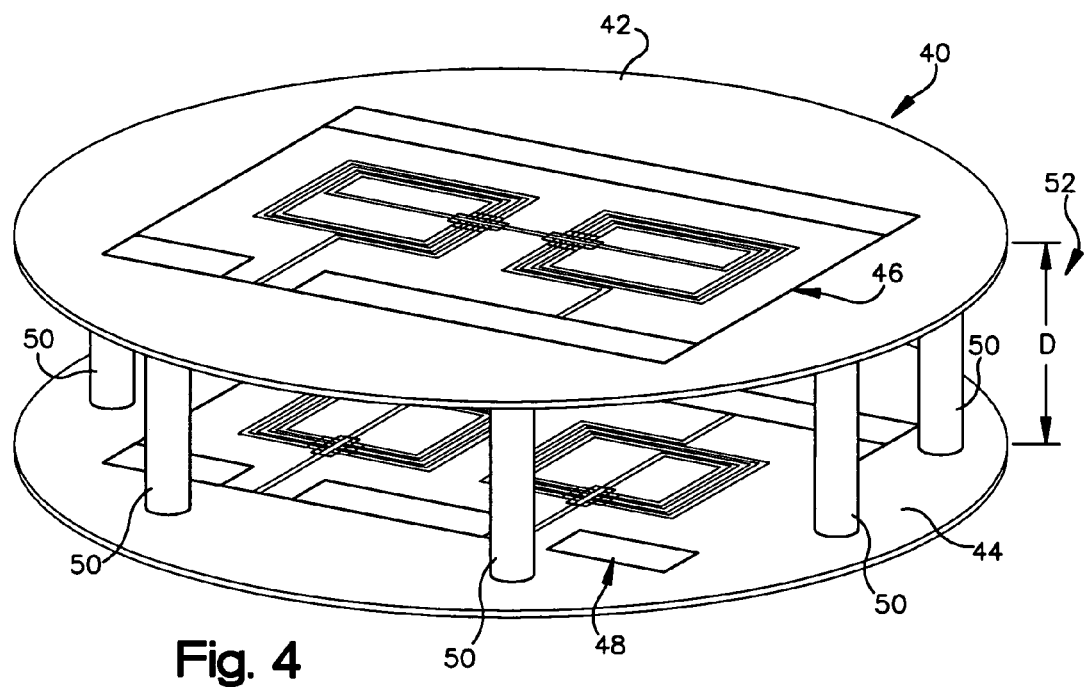
FIG. 4 illustrates a 3D MMIC balun fabricated employing wafer level packaging in accordance with an aspect of the present invention.

The present invention relates to a three dimensional (3D) MMIC balun and methods of making the same. A primary spiral winding is spaced apart from a secondary primary winding by a gap in a substantially aligned stacked configuration forming a balun. The gap medium can be a low dielectric constant material if employing a multi-metal process or air if employing a wafer level packaging process.

FIG. 1 illustrates a perspective view of a three dimensional (3D) MMIC balun 10 in accordance with an aspect of the present invention. The balun 10 of FIG. 1 is a differential wideband center tapped balun capable of producing multi-octave bandwidth. The balun 10 includes a primary twin spiral winding 12 disposed along a first plane and a secondary twin spiral winding 14 disposed along a second plane spaced apart by a gap 15 having a selectable distance D. The first plane is substantially parallel to the second plane, such that the gap 15 extends substantially over an entire area of both the primary twin spiral winding 12 and the secondary twin spiral winding 14. The primary winding 12 has a first spiral 16 stacked above or below and substantially aligned with a first spiral 22 of the secondary winding 14, and a second spiral 18 stacked above or below and substantially aligned with a second spiral 24 of the secondary winding 14. The twin spiral configuration and the substantial alignment of the primary and the secondary spiral windings 12 and 14 enhances the self inductance and mutual inductance of the primary and secondary windings 12 and 14 allowing the balun to operate not only at higher frequencies (e.g., about 20 GHz) but also operate at lower frequencies (e.g., 1 GHz). The 3D stacked structure of the 3D MMIC balun 10 provides a substantially smaller periphery to a planar counterpart.

The primary winding 12 has an input 20, and the secondary winding 14 has a first output 26 and a second output 28 to provide a differential output signal from a single ended input signal. The second output 28 provides an output signal that is 180° out of phase from an output signal provided at the first output 26. The winding ratio can be adjusted to achieve similar input and output impedances. Due to the stack-up structural configuration, the balun 10 can also be small in size and can be integrated on-chip with other MMIC circuitries of a given system. For example, the primary and secondary windings 12 and 14 can have a width of about 200 microns to about 400 microns and a length of about 200 microns to about 400 microns. Therefore, its compatibility with MMIC processing, low cost and reliability make it an ideal candidate for many electronic systems.

FIG. 2 illustrates a plan view of a face of the twin spiral primary winding 12 of FIG. 1. The primary winding 12 includes the input 20 routed to a first end of the first spiral 16 of the twin spiral primary winding 12. A second end of the first spiral 16 of the twin spiral primary winding is connected to a first end of the second spiral 18. A second end of the second spiral 18 of the twin spiral primary winding 12 is connected to a ground plane 17. The ground plane 17 surrounds the twin spiral primary winding 12 to electrically isolate the twin spiral primary winding 12 from other circuitry.

FIG. 3 illustrates a plan view of a face of the twin spiral secondary winding 14 of FIG. 1. The secondary winding 14 includes a first end of the first spiral 22 and a first end of the second spiral 24 coupled to a ground plane 25. A second end of the first spiral 22 of the twin spiral secondary winding 14 is provided as the first output 26. A second end of the second spiral 24 of the twin spiral secondary winding 14 is provided as the second output 28. The ground plane 25 surrounds the twin spiral secondary winding 14 to electrically isolate the twin spiral secondary winding 14 from other circuitry.

As illustrated in FIG. 1, the face of the twin spiral primary winding 12 faces the face of the twin spiral secondary winding 14 separated by a gap 15 of distance D with the first spiral 16 of the primary winding 12 stacked above or below and substantially aligned with the first spiral 22 of the secondary winding 14, and the second spiral 18 of the primary winding 12 stacked above or below and substantially aligned with the second spiral 24 of the secondary winding 14. In one aspect of the invention, the gap 15 can be formed by employing a low dielectric constant material (e.g., about 2 microns to about 12 microns) between the twin spiral secondary winding 14 and the twin spiral primary winding 12 in a multi-metal MMIC process.

In another aspect of the invention, the gap 15 can be formed by employing wafer level packaging (WLP), such that the primary winding 12 is formed on a first wafer and the secondary winding 14 is formed on a second wafer. The first and second wafers are then stacked separated by bonding posts to achieve a selected distance for the gap 15 based on a desired frequency range. In this embodiment, the dielectric between the primary and secondary winding is air with a dielectric constant of 1 mitigating parasitic and shunt capacitances between the primary and secondary winding allowing for a wideband frequency balun operation having a substantially high frequency to low frequency ratio operation from about 10:1 to about 20:1 (e.g., 18:1). The gap can be about 2 microns to about 12 microns. However, the gap can be greater than 12 microns based on a desired implementation.

WLP is a relatively new type of MMIC packaging technology that enables the high performance wide bandwidth balun design that other approaches cannot achieve. In WLP technology, the two wafers are fabricated individually. They can use any combination of semiconductor materials or technologies, such as InP, GaN, GaAs, Si, SiGe, quartz or any future materials etc. This allows for utilizing different semiconductor technologies to fully exploit the advantages offered by various processes. Next, the two wafers are assembled on top of each other with substantially precise alignment. The two wafers are connected together with bonding posts. As a result, an air gap is created between these two wafers. The employment of the low dielectric constant media of air lowers the parasitic capacitance. The lower parasitic capacitance translates to higher self-resonance frequency (SRF), lower insertion loss, and higher Q resulting in a very wide bandwidth compared with conventional approaches. Additionally, the employment of wafer level packaging can improve the output phase and amplitude balance significantly compared with a printed wiring board approach due to the ability to achieve tighter tolerances.

FIG. 4 illustrates a 3D MMIC balun 40 formed employing wafer level packaging in accordance with an aspect of the present invention. A primary winding 46 is fabricated on a first wafer 42 and a secondary winding 48 is fabricated on a second wafer 44. The first wafer 42 and thus the primary winding 46 is separated by the second wafer 44 and thus the secondary winding 48 by a gap 52 having a selectable distance D employing a plurality of bonding posts 50. The height of the bonding posts can be selected to select the distance D, and also be employed to bond the first wafer 42 to the second wafer 44. The distance D can be selected based on a particular implementation. The employment of wafer level packaging provides for a selectable air gap between the primary and secondary windings 46 and 48 on two different wafers stacked on the top of each other.

An air gap over a substantial portion of the primary winding and the secondary winding provides an optimal dielectric medium between the primary and secondary winding resulting in the least amount of shunt capacitance and parasitic capacitance compared with other dielectric mediums. The employment of the air gap in combination with a twin spiral primary and a twin spiral secondary winding balun configuration, as illustrated in FIGS. 1-3 has been found to provide substantially high frequency to low frequency ratio operation of about 10:1 to about 20:1 (e.g., 18:1) to provide a true differential wideband center tapped Balun, capable of producing multi-octave bandwidth for air gaps between about 2 microns to about 12 microns. In one aspect of the invention, the wafer level packaged twin spiral balun configuration can operate from about 1 GHz to about 20 GHz. In another aspect of the present invention, the wafer level packaged twin spiral balun configuration can operate from about 500 MHz to about 10 GHz.

It is to be appreciated that the employment of wafer level packaging approach can be adopted to fabricate a variety of different MMIC balun types, such as a single primary and secondary winding balun configuration, such as an impedance balun employing the selectable air gap as a dielectric medium. It is to be appreciated that other types of functional electrical circuits can be fabricated on the first and second wafers 42 and 44 or on other wafers electrically to achieve single-chip integration with the balun.

Figure 5:
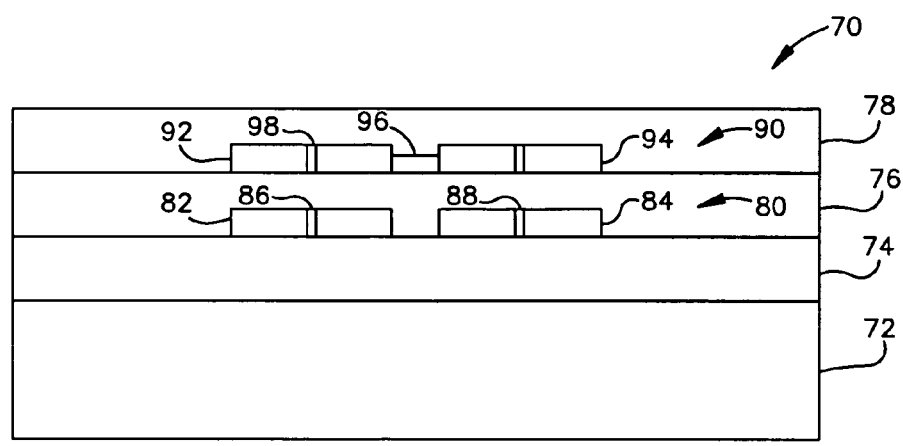
FIG. 5 illustrates a 3D twin spiral balun fabricated with a multi-metal process in accordance with an aspect of the present invention.

FIG. 5 illustrates a 3D twin spiral balun configuration balun 70 fabricated with a multi-metal process in accordance with an aspect of the present invention. A first dielectric layer 74 is formed over a semiconductor substrate 72. A twin spiral secondary winding 80 is formed over the first dielectric layer 74, for example, by depositing a metal over the first dielectric layer 74 and etching the twin spiral secondary winding 80. The twin spiral secondary winding 80 has a first spiral 82 with a first output 86 and a second spiral 84 with a second output 88. The first spiral 82 and the second spiral 84 are disposed adjacent one another and electrically isolated from one another. A second dielectric layer 76 is deposited over the secondary winding 80 with a thickness selected based on a desired gap between a twin spiral primary winding 90 and the twin spiral secondary winding 80.

The twin spiral primary winding 90 is formed on the second dielectric layer 76, for example, by depositing a metal over the second dielectric layer 76 and etching the twin spiral primary winding 90. The twin spiral primary winding 90 has a first spiral 92 with a first end provided as an input 98. A second end of the first spiral 92 is electrically coupled to a first end of a second spiral 94 via an electrical connector or trace 96 with a second end of the second spiral 94 coupled to a ground plane. The first spiral 92 and the second spiral 94 are disposed adjacent one another with the first spiral 92 of the twin spiral primary winding 90 being disposed above and substantially aligned with the first spiral 82 of the twin spiral secondary winding 80, and the second spiral 94 of the twin spiral primary winding 90 being disposed above and substantially aligned with the second spiral 84 of the twin spiral secondary winding 80. A third dielectric layer 78 is deposited over the twin spiral primary winding 90 to complete the fabrication of the 3D twin spiral configuration balun 70. It is to be appreciated that other electrical circuits can be fabricated on the first and second wafers 42 and 44 or on other wafers electrically coupled to the twin spiral balun configuration balun 70.

Figure 6:
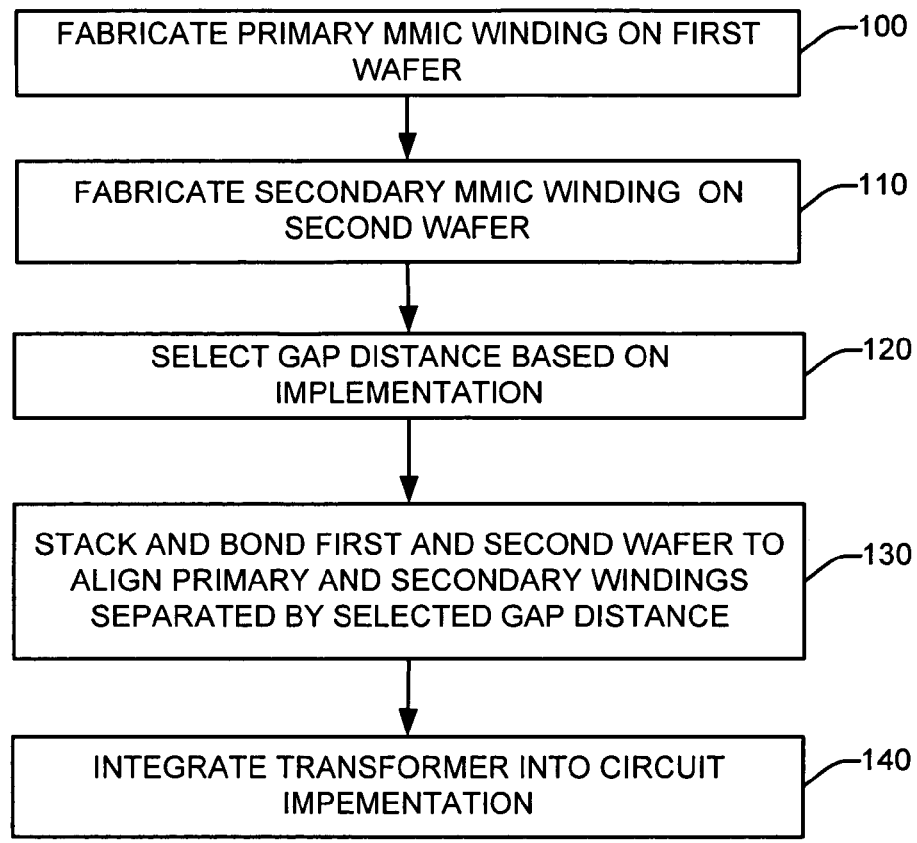
FIG. 6 illustrates a methodology for forming a 3D MMIC balun in accordance with an aspect of the present invention.
Figure 7:
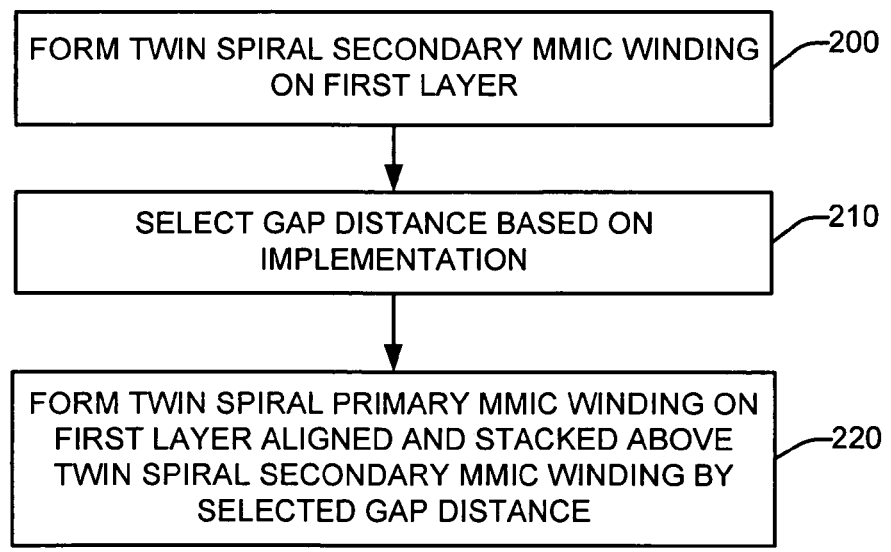
FIG. 7 illustrates another methodology for forming a 3D MMIC balun in accordance with an aspect of the present invention.

In view of the foregoing structural and functional features described above, a methodology in accordance with various aspects of the present invention will be better appreciated with reference to FIGS. 6-7. While, for purposes of simplicity of explanation, the methodologies of FIGS. 6-7 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 6 illustrates a methodology for forming a 3D MMIC balun in accordance with an aspect of the present invention. At 100, a primary MMIC winding is fabricated on a first wafer. At 110, a secondary MMIC winding is fabricated on the second wafer. The primary winding and the secondary winding can be a single spiral or twin spiral configuration. At 120, a gap distance (e.g., about 2 microns to about 12 microns) is selected based on a desired implementation. At 130, the first wafer and the second wafer are stacked and bonded to substantially align respective windings of the primary and secondary windings separated by the selected gap distance. At 140, the MMIC balun is integrated into a circuit implementation, such as an amplifier, mixer or oscillator.

FIG. 7 illustrates another methodology for forming a 3D MMIC balun in accordance with an aspect of the present invention. At 200, a twin spiral secondary MMIC winding is formed on a first layer. The first layer can be a metal layer disposed over a dielectric layer. Alternatively, the first layer can reside in a first wafer. At 210, a gap distance is selected based on a desired implementation. The medium in the gap can be a low K dielectric for a metal layer process or air in a wafer level packaging process. The methodology then proceeds to 220. At 220, a twin spiral primary MMIC winding is formed on a second layer substantially aligned and stacked above respective windings of the twin spiral secondary MMIC winding separated by the selected gap distance. The second layer can be a metal layer disposed over a dielectric layer formed over the twin spiral secondary MMIC winding. Alternatively, the second layer can reside in a second wafer disposed over the first wafer via bond posts forming an air gap therebetween.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A three dimensional (3D) monolithic integrated circuit (MMIC) balun comprising:
    a twin spiral secondary winding; and
    a twin spiral primary winding arranged in a stacked configuration with the twin spiral secondary winding spaced apart by an air gap having a selectable distance, wherein the air gap extends over at least a substantial area of both the twin spiral secondary winding and the twin spiral primary winding.

2. The MMIC balun of claim 1, wherein a dielectric medium in the air gap has a dielectric constant of one.

3. The MMIC balun of claim 1, wherein the twin spiral secondary winding lies in a first plane and the twin spiral primary winding lies in a second plane substantially parallel to the first plane separated by the air gap.

4. The MMIC balun of claim 1, wherein the twin spiral primary winding is fabricated on a first wafer and the twin spiral secondary winding is fabricated on a second wafer, the first wafer and second wafer arranged in a stacked configuration to substantially align the twin spiral primary winding with the twin spiral secondary winding spaced apart by the air gap.

5. The MMIC balun of claim 1, wherein the balun has a high frequency to low frequency operation ratio from between about 10:1 to about 20:1.

6. The MMIC balun of claim 1, wherein the twin spiral primary winding and the twin spiral secondary winding have widths of about 200 microns to about 400 microns and lengths of about 200 microns to about 400 microns.

7. The MMIC balun of claim 1, wherein the selectable distance of the air gap is about 2 microns to about 12 microns.

8. The MMIC balun of claim 1, wherein the twin spiral secondary winding has a first spiral and a second spiral and the twin spiral primary winding has a first spiral substantially aligned above the first spiral of twin spiral secondary winding and a second spiral substantially aligned above the second spiral of twin spiral secondary winding.

9. The MMIC balun of claim 8, wherein the first spiral of the twin spiral primary winding has a first end provided as an input and a second end coupled to a first end of the second spiral of the twin spiral primary winding with a second end of the second spiral of the twin spiral primary winding connected to a ground plane, and the first spiral of the twin spiral secondary winding providing a first output and the second spiral of the twin spiral secondary winding providing a second output that is about 180° out of phase with the first output.

10. A three dimensional (3D) microwave monolithic integrated circuit (MMIC) balun comprising:
    a secondary winding disposed on a first wafer; and
    a primary winding disposed on a second wafer, the first and second wafers arranged in a stacked configuration with the secondary winding spaced apart from the primary winding by an air gap having a selectable distance.

11. The MMIC balun of claim 10, wherein:
    the primary winding is a twin spiral winding;
    the secondary winding is a twin spiral winding; and
    the primary and secondary twin spiral windings are substantially aligned.

12. The MMIC balun of claim 10, wherein the balun is an impedance balun having substantially aligned single spiral primary and secondary MMIC windings.

13. The MMIC balun of claim 10, wherein the first wafer and second wafer are arranged in a stacked configuration to substantially align the primary winding with the secondary winding spaced apart by an air gap employing bonding posts.

14. The MMIC balun of claim 10, wherein the selectable distance of the air gap is about 2 microns to about 12 microns.

15. A method for forming a three dimensional (3D) microwave monolithic integrated circuit (MMIC) balun, the method comprising:

forming a twin spiral secondary winding on a first plane; and forming a twin spiral primary winding on a second plane substantially parallel and spaced apart by an air gap from the first plane wherein the twin spiral secondary winding and the twin spiral primary winding are substantially aligned in a stacked configuration.

16. The method of claim 15, wherein the air gap has a selectable distance of about 2 microns to about 12 microns.

17. The method of claim 15, wherein the forming a twin spiral winding on a first plane comprises forming the twin spiral secondary winding on a first wafer and the forming a twin spiral primary winding on a second plane comprises forming the twin spiral primary winding on a second wafer.

18. The method of claim 17, further comprising arranging the first wafer and the second wafer in a stacked arrangement separated by bonding posts that form the air gap therebetween.

* * * * *